(12) United States Patent
Zhang et al.

(10) Patent No.: US 6,737,811 B2
(45) Date of Patent: May 18, 2004

(54) HIGH INTENSITY LIGHT SOURCE ARRANGEMENT

(75) Inventors: Long Bao Zhang, Shanghai (CN); Hai Liao, Shanghai (CN)

(73) Assignee: A L Lightech, Inc., Anaheim, CA (US)

( * ) Notice: Subject to any disclaimer, the term of this patent is extended or adjusted under 35 U.S.C. 154(b) by 360 days.

(21) Appl. No.: 09/882,580

(22) Filed: Jun. 16, 2001

(65) Prior Publication Data

US 2002/0191403 A1 Dec. 19, 2002

(51) Int. Cl.[7] ................................................. H01J 13/46
(52) U.S. Cl. .......................... 315/56; 362/555; 362/241
(58) Field of Search ................................ 362/294, 373, 362/255, 545, 800, 219, 241; 257/712; 315/56, 291, 307, 209 R

(56) References Cited

U.S. PATENT DOCUMENTS

| | | | | |
|---|---|---|---|---|
| 5,924,785 A | * | 7/1999 | Zhang et al. | 362/241 |
| 5,924,787 A | * | 7/1999 | McEllen et al. | 362/263 |
| 6,012,825 A | * | 1/2000 | Horner et al. | 362/260 |
| 6,367,944 B1 | * | 4/2002 | Wang | 315/119 |
| 6,578,998 B2 | * | 6/2003 | Zhang | 362/555 |

* cited by examiner

Primary Examiner—James Clinger
Assistant Examiner—Jimmy T. Vu
(74) Attorney, Agent, or Firm—Raymond Y. Chan; David and Raymond Patent Group

(57) ABSTRACT

A high intensity light source arrangement, which can prolong the service life span of the high intensity light source arrangement by better dissipating and reducing the heat generated, includes a luminary unit comprising a luminary circuit, at least a terminal electrically connected to the luminary circuit, and at least a luminary element adapted for electrifying with the terminal to emit light; a heat dissipation unit supporting the luminary unit and dissipating heat generated from the luminary unit; and a base housing for supporting the heat dissipation unit thereon including an electric input connector electrically connecting to the luminary unit.

63 Claims, 17 Drawing Sheets

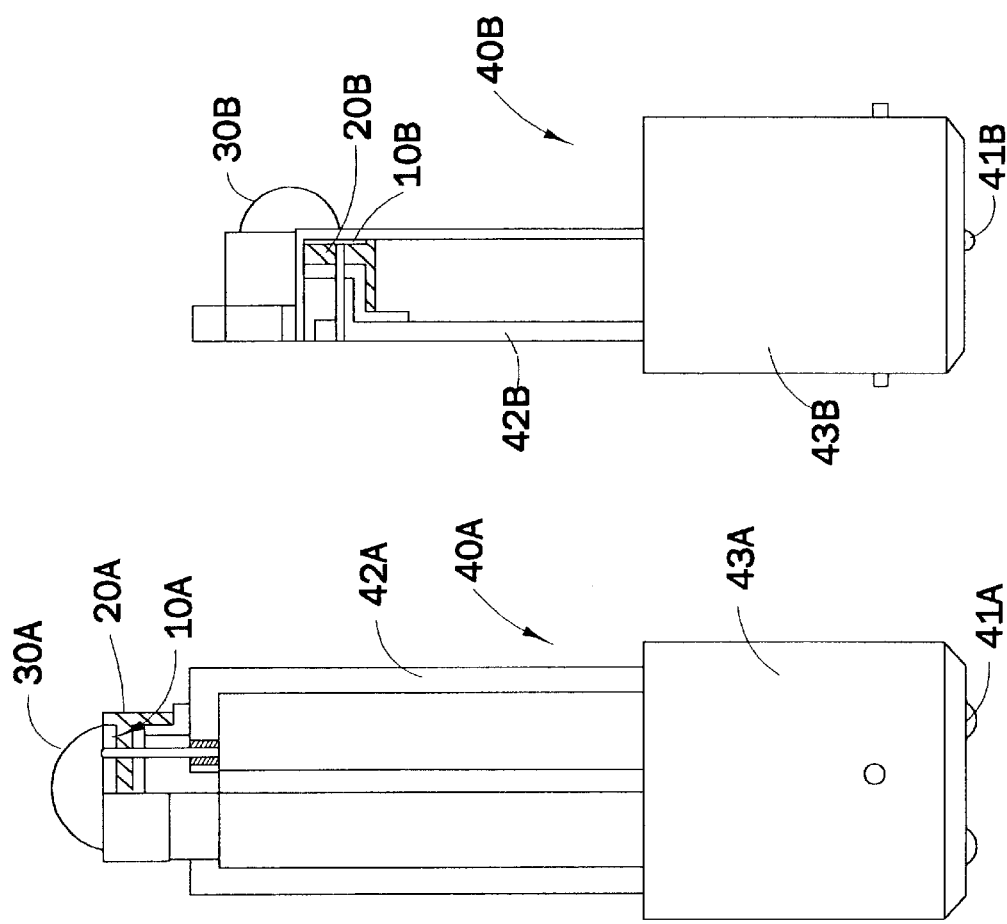
FIG.11
FIG.10
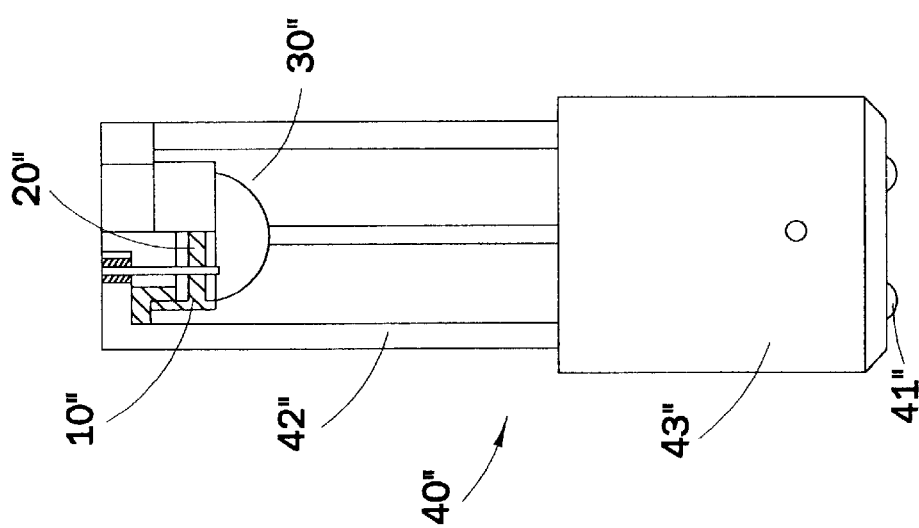
FIG.9

HIGH INTENSITY LIGHT SOURCE ARRANGEMENT

BACKGROUND OF THE PRESENT INVENTION

1. Field of Invention

The present invention relates to a light source arrangement, and more particularly to a high intensity light source arrangement which can enhance brightness of emitting light and increase the cooling effect of the light source arrangement while using low current and voltage.

2. Description of Related Arts

Nowadays, the most common light sources are filament lamp bulb for illumination and LED lighting for indication. Due to the remarkable features of low power consumption and instant light emission. LED lighting is specially adapted to be utilized in many electrical appliances as signal and indicating lighting, such as the power on-off signal light and instructional signal light of electric equipment, indicating light of electronic clock, and etc. . . .

Although the LED has excellent properties of low power consumption and instant light emission, the relatively small light intensity and lighting emission angle of the LED make it not suitable to use for illumination or even apply in some specific area such as traffic light, signboard light vehicle brake light and signal light, and airport guiding lighting.

In order to increase the light intensity of the LED, a larger current can be applied to the LED so as to increase the electrical power thereof. However, due to the structure of the LED. when increasing the current, heat generated from the LED will burn the LED.

In addition, the major drawback of the LED is that the LED cannot produce white light. It is known that white light is composed of red, blue, and green lights. A single LED is capable of producing red, blue, and green lights individually but not the daily used white light.

In order to produce a white light, an improved LED comprises a blue zinc luminary element and a fluorescent layer powdered on an inner surface of a reflexive cover, wherein when light is produced by the luminary element and reflexed on the fluorescent layer, the white light is produced. However, the fluorescent layer cannot be evenly applied on the inner surface of the reflexive cover so that the white light will not be evenly dispersed from the reflexive cover so as to provide an uneven intensity of the white light.

SUMMARY OF THE PRESENT INVENTION

A main object of the present invention is to provide a high intensity light source arrangement which can prolong the service life span of the high intensity light source arrangement by better dissipating and reducing the heat generated.

Another object of the present invention is to provide a high intensity light source arrangement which greatly increases the brightness of the light emitted, wherein the light source arrangement is capable of providing a light intensity up to five times or more of a conventional LED.

Another object of the present invention is to provide a high intensity light source arrangement which comprises a heat dissipation unit directly mounted underneath a circuit board for efficiently dissipating heat therefrom. Therefore, a plurality of luminary elements is capable of electrifying with the terminals on the circuit board.

Another object of the present invention is to provide a high intensity light source arrangement adapted for producing a white light by selectively arranging the luminary elements of the luminary unit.

Another object of the present invention is to provide a high intensity light source arrangement adapted for selectively controlling the color of the light from the luminary unit.

Another object of the present invention is to provide a high intensity light source arrangement wherein a fluorescent layer is evenly coated on an inner surface of a head cover of the high intensity so as to enhance the white light evenly dispersed therefrom.

Accordingly, in order to accomplish the above objects, the present invention provides a high intensity light source arrangement, comprising:

a luminary unit comprising a luminary circuit, at least a terminal electrically connected to the luminary circuit, and at least a luminary element adapted for electrifying with the terminal to emit light;

a heat dissipation unit supporting the luminary unit and dissipating heat generated from the luminary unit; and a base housing for supporting the heat dissipation unit thereon comprising an electric input connector electrically connecting to the luminary unit.

BRIEF DESCRIPTION OF THE DRAWINGS

FIG. 9 is a partially sectional view of a high intensity light source arrangement according to a third preferred embodiment of the present invention.

FIG. 10 is a partially sectional view of a first alternative mode of the high intensity light source arrangement according to the above third preferred embodiment of the present invention.

FIG. 11 is a partially sectional side view of a second alternative mode of the high intensity light source arrangement according to the above third preferred embodiment of the present invention.

DETAILED DESCRIPTION OF THE PREFERRED EMBODIMENTS

Figure 1:
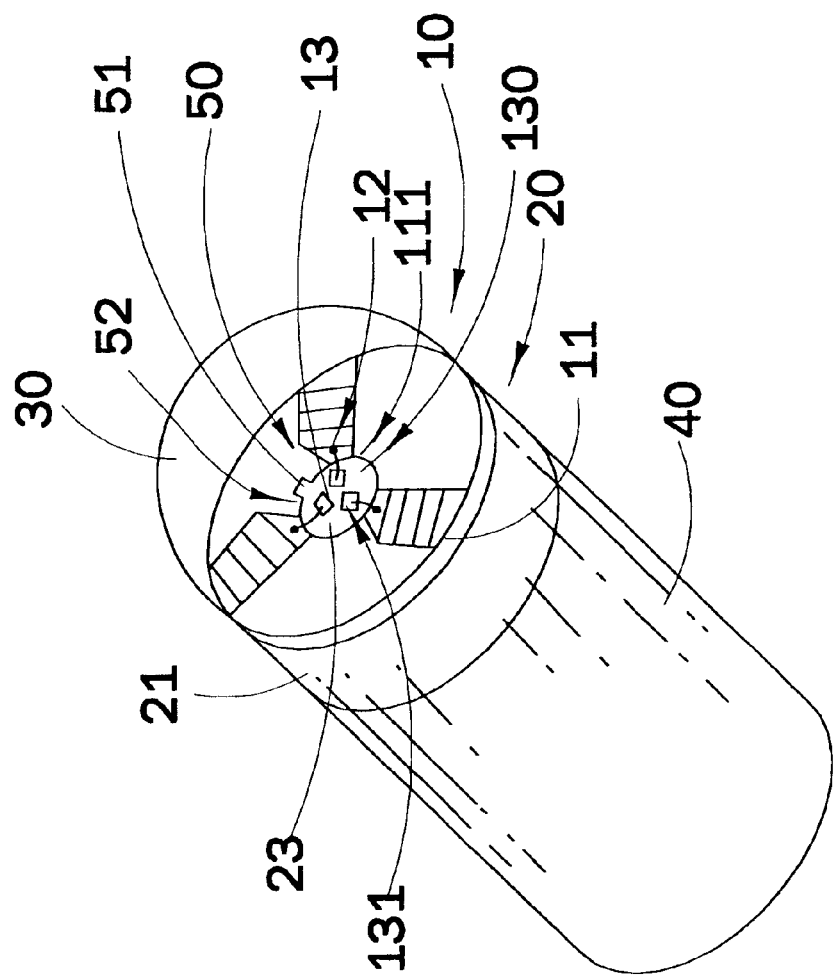
FIG. 1 is a perspective view of a high intensity light source arrangement according to a first preferred embodiment of the present invention.
Figure 2:
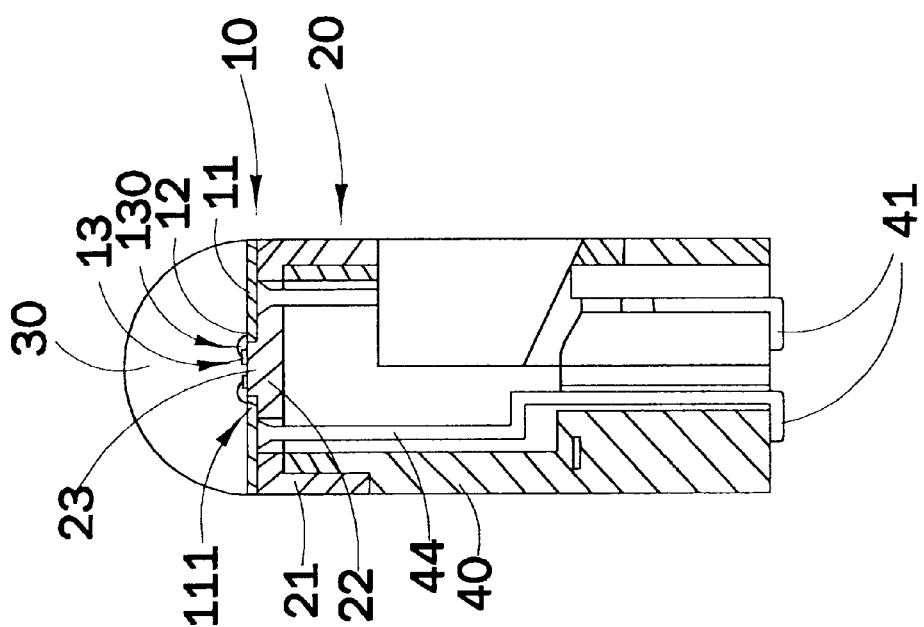
FIG. 2 is a partial section view of the high intensity light source arrangement according to the above first preferred embodiment of the present invention.

Referring to FIGS. 1 and 2 of the drawings, a high intensity light source arrangement according to a first preferred embodiment of the present invention is illustrated. The high intensity light source arrangement comprises a luminary unit 10, a heat dissipation unit 20 and a base housing 40.

The luminary unit 10 comprises a luminary circuit 11 which can be a circuit board or a printed circuit film, at least a terminal 12 electrically connected to the luminary circuit 11, and at least a luminary element 13 adapted for electrifying with the terminal 12 to emit light.

The heat dissipation unit 20 supports underneath the luminary unit 10 for directly dissipating heat generated from the luminary unit 10. A transparent head shelter 30 is mounted on the luminary unit 10 in an airtight manner. The base housing 40 which connects to the heat dissipation unit 20 comprises an electric input connector 41 electrically connecting to the luminary unit 10, as shown in FIG. 2.

According to the first preferred embodiment, the luminary circuit 11 of the luminary unit 10 is made in ring shape that has a center through hole 111. Also, the luminary circuit 11 has three or more terminals 12 provided thereon, as shown in FIG. 1.

The heat dissipation unit 20 comprises a circular ring body 21, a ceiling wall 22 integrally formed at a top end of the ring body 21 and a circular supporting platform 23 integrally projected from a center position of the ceiling wall 22 of the heat dissipation unit 20.

The luminary unit 10 securely sits on the ceiling wall 22 of the heat dissipation unit 20 by fittedly inserting the supporting platform 21 into the center through hole 111 of the luminary circuit 11, wherein the bottom surface and the inner circumferential side of the luminary unit 10 are well contact with the top surface and the outer circumferential side of the ceiling wall 22 of the heat dissipation unit 20, so that the heat generated from the luminary unit 10 is capable of directly dissipating from the heat dissipation unit 20 to outside so as to increase the cooling effect of the luminary unit 10. In other words, the contact area between the luminary circuit 11 and the heat dissipation unit 20 is increased so as to enhance the cooling effect of the heat dissipation unit 20 for dissipating heat for the luminary unit 10. Moreover, the extended ring body 21 of the heat dissipation unit 20 not only provides a solid connection with the base housing 40 but also substantially increases the heat dissipating area with the outside environment to further increase the heat dissipating effect.

It is worth to mention that when each of the luminary elements 13 is electrified with the respective terminal 12, the luminary element 13 not only emits light but also generates heat that may burn off the luminary element 13 itself while the luminary element 13 is overheated. Since the luminary elements 13 are directly supported on the supporting platform 21, the heat from the luminary elements 3 is capably of directly transferring and dissipating to the heat dissipation unit 20 and better preventing the luminary elements 13 from overheating.

The head shelter 30 is securely mounted on the heat dissipation unit 20 in an airtight manner wherein the luminary unit 10 is protected by the head shelter 30 for resisting shock and vibration. The head shelter 30 is a semi-spherical shaped transparent body protruded from the luminary unit 10 and the luminary elements 13 are positioned at a center of the head shelter 30 such that the light can evenly distributed to an exterior of the head shelter 30, wherein the light from the luminary unit 10 is adapted for passing through the head shelter 30 to outside. Accordingly, the head shelter 30 is made by molding a semi-spherical shape of transparent material having high thermo-resistance ability, such as transparent epoxy resin, on the luminary unit 10 and the supporting platform 23 that integrally joins the luminary unit 10, the heat dissipation unit 20 and the head shelter 30 to form an integral body.

The base housing 40 is a hollow body that securely supports the heat dissipation unit 20 thereon, wherein connectors 44 are electrically extended from the luminary unit 10 to a pair of electric input connectors 41 provided at a bottom portion of the base housing 40 for electrically connecting the luminary unit 10 with a power supply device.

As shown in FIG. 1, the high intensity light source arrangement further comprises a guiding means 50 for securely mounting the luminary unit 10 on the heat dissipation unit 20 in position wherein the guiding means 50 comprises a guiding latch 51 which is vertically projected from a side edge of the supporting platform 21 of the heat dissipation unit 20 and arranged to fit into a guiding groove 52 formed on the inner circumferential side of the center through hole 111 of the luminary circuit 11 in such a manner that the luminary elements 13 on the supporting platform 21 are aligned with the terminals 12 respectively for electrified.

It is worth to mention that each luminary element 13 can produce at least the same amount of light intensity of a conventional LED. Since when a plurality of the luminary elements 13 are gathered together, multiple amount of heat will be generated that may cause a conventional LED structure to burn out. However, since the plurality of the luminary elements 13 are supported on the supporting platform 21 of the heat dissipation unit 20, the heat from the luminary elements 13 as well as the luminary unit 10 is directly transferred to the heat dissipation unit 20 for preventing the luminary elements 13 and the luminary unit 10 from being overheated. Therefore, the luminary unit 10 of the high intensity light arrangement can multiple the light intensity by providing a plurality of luminary elements 13 without burning off the luminary unit 10.

Accordingly, it is possible to have three different kinds of luminary elements 13 attached on the supporting platform 23 of the heat dissipation unit 20 and electrically connected with the three terminals 12 respectively for producing different colors of light such as red, blue, or green.

According to the first preferred embodiment of the present invention, the three luminary elements 13, which are made of different materials, are adapted for producing red, green, and blue colors of light respectively, wherein the distance between the three luminary elements 13 is minimized to form a lighting spot 130 so that the red, green, and blue lights produced at the same time form the white light.

Figure 4:
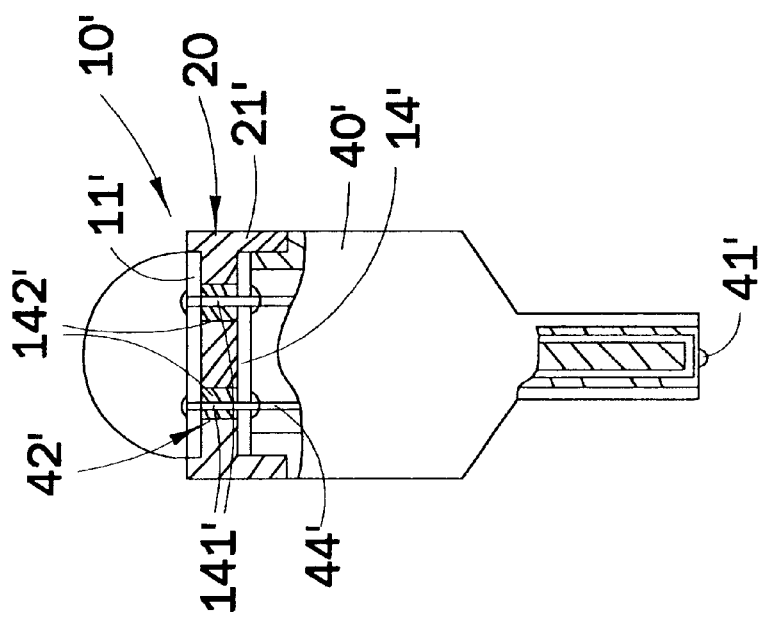
FIG. 4 is a partial section view of the alternative mode of the high intensity light source arrangement according to the above first preferred embodiment of the present invention.
Figure 3:
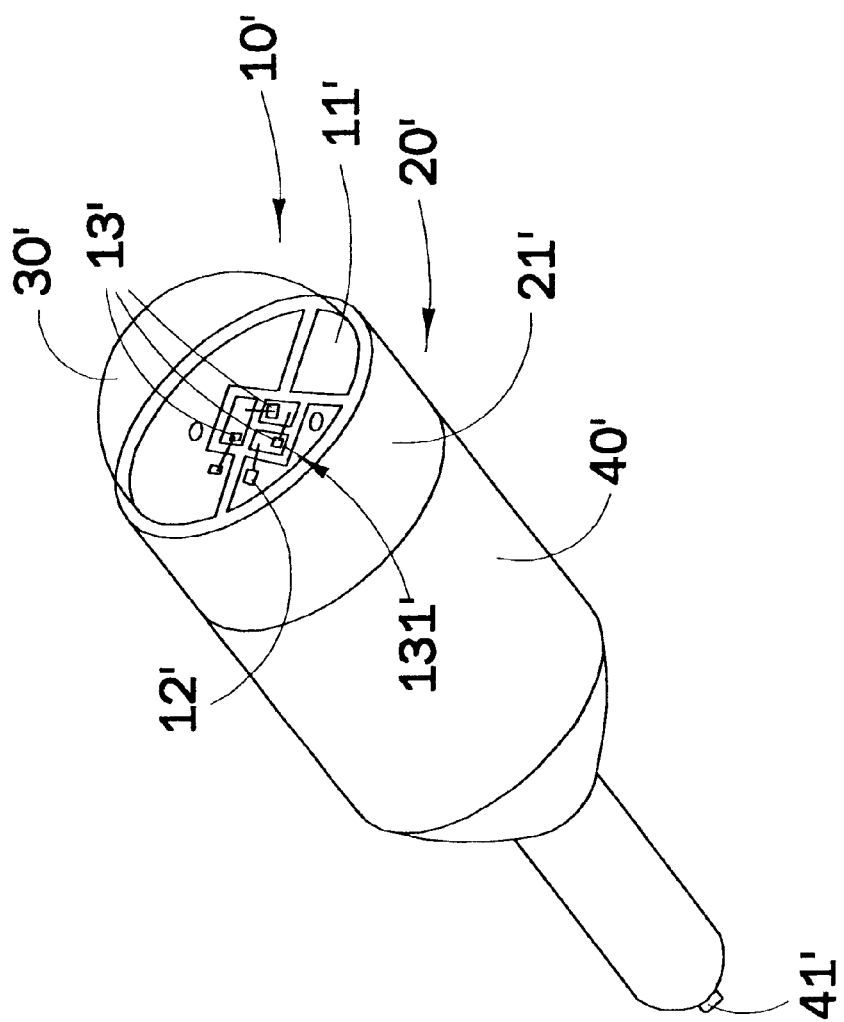
FIG. 3 is a perspective view of an alternative mode of the high intensity light source arrangement according to the above first preferred embodiment of the present invention.

FIGS. 3 and 4 illustrates an alternative mode of the high intensity light source arrangement according to the above first preferred embodiment of the present invention, wherein the luminary circuit 11' of the luminary unit 10' is a circuit board or a printed circuit film having a circular shape firmly attached to a flat top side the ceiling wall 22' of the heat dissipation unit 20', wherein since the luminary unit 10' is alternatively embodied as a complete circular piece, no supporting platform 23 is provided on the ceiling wall 22' according to this alternative mode.

The luminary circuit 11' comprises isolating diodes and three luminary elements 13' connected to a center portion of the luminary circuit 11' to electrify with the respective terminals 12' positioned closed to the luminary elements 13'. The luminary unit 10' further comprises an auxiliary luminary circuit 14', as shown in FIG. 4, which is firmly attached to a bottom side of the ceiling wall 22' of the heat dissipation unit 20', containing resistors to electrically connect with the luminary circuit 11' by means of conduction rivets 141' which connect the upper luminary circuit 11' with the lower auxiliary luminary circuit 14' through the ceiling wall 22' of the heat dissipation unit 20' via the respective insulation sleeves 142' provided in the ceiling wall 22'.

In other words, for securely mounting the luminary unit 10' on the heat dissipation unit 20', two or more through holes 42' penetrate through the ceiling wall 22' of the heat dissipation unit 20', wherein the insulation sleeves 142' are inserted in the through holes respectively. The conduction rivets 141' penetrate through the insulation sleeves 142' respectively for both physically and electrically connecting the luminary circuit 11' with the auxiliary luminary circuit 14' to the heat dissipation unit 20'. Thus, connectors 44' are electrically extended from the conduction rivets 141' so as to electrically connect the luminary unit 10' to the electric input connector 41' of the base housing 40'. Similarly, the heat generated from the luminary circuit 11' and the auxiliary luminary circuit 14' will transferred to the heat dissipation unit 20'. Like the first preferred embodiment, a semispherical transparent head shelter 30' also covers the luminary unit 10' in an airtight manner.

According to the first preferred embodiments of the present invention, the luminary circuit 11 or the luminary circuit 11' and the auxiliary luminary circuit 14' should be made of good conductive material for conducting heat generated therefrom to the heat dissipation unit 20, 20' for heat dissipation without overheating the luminary unit 10, 10'.

Figure 7:
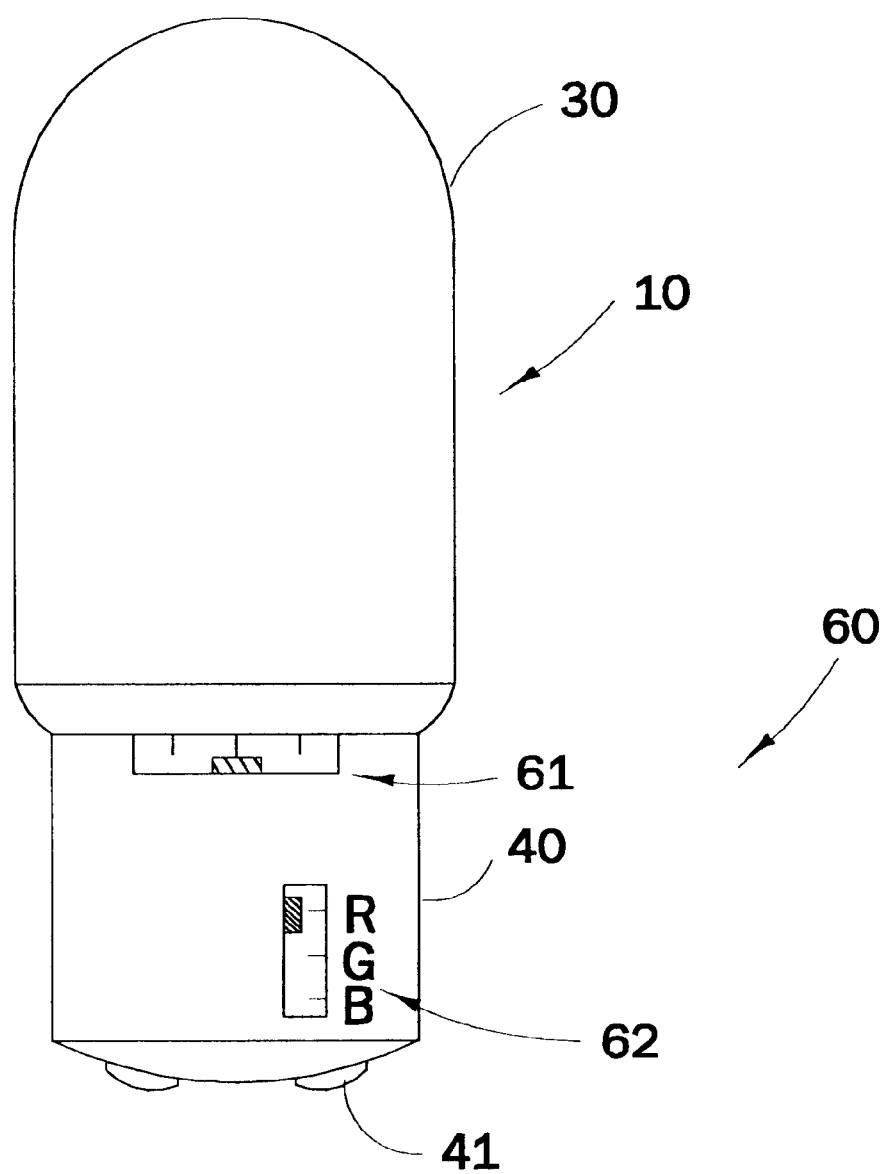
FIG. 7 illustrates a controlling device incorporated with the high intensity light source arrangement according to the above first preferred embodiment of the present invention.

FIG. 7 shows an alternative appearance of the high intensity light source arrangement of the present invention, wherein it further comprises a controlling device 60 for selectively controlling a flow of current passing to the luminary unit 10, as shown in FIG. 7 so as to adjust the light intensity of the luminary unit 10 and select the color of the light of the luminary unit 10. The controlling device 60, which is provided on the base housing 40, comprises a light control switch 61 for adjustably controlling the light intensity of the luminary unit 10 and a color control switch 62 for selecting the color of the light by selecting the red, blue or green luminary element 13 to produce predetermined color of light, such as red, blue or green.

Figure 5C:
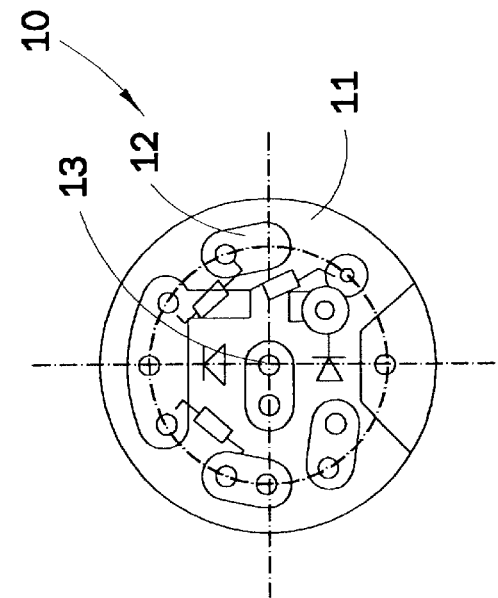
FIGS. 5A to 5C illustrate different circuits of the luminary unit of the high intensity light source arrangement according to the above first preferred embodiment of the present invention.
Figure 5B:
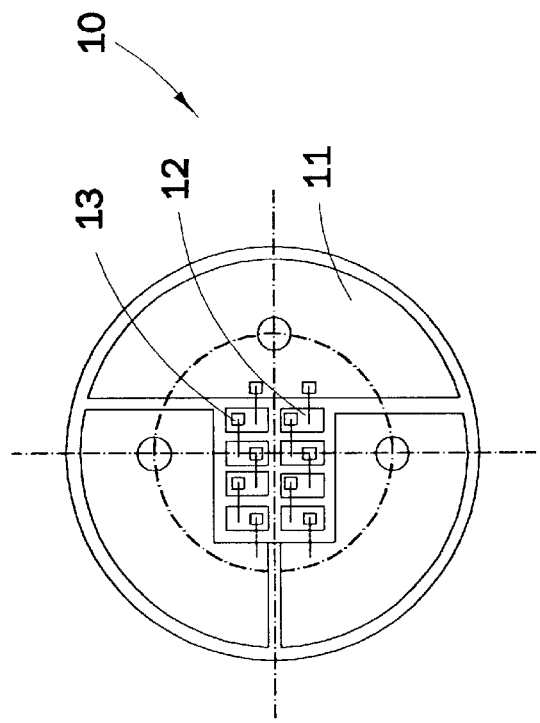
Figure 5A:
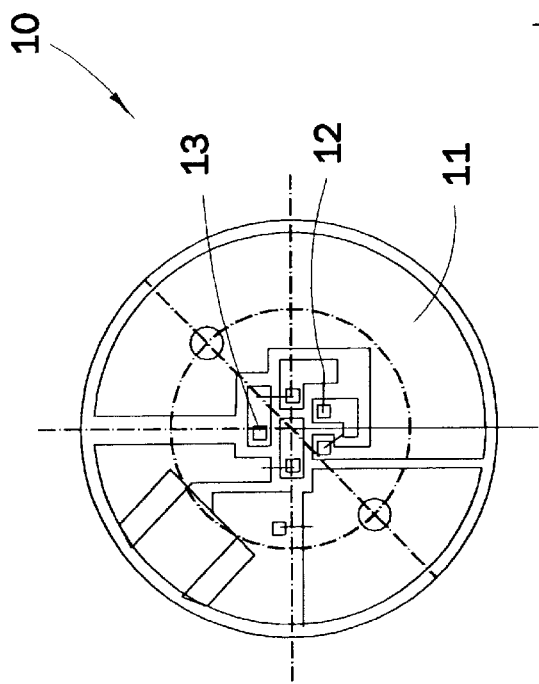

As shown in FIGS. 5A to 5C, for controlling the light and color by the controlling means 60 of the present invention, different arrangements of the luminary elements 13' according to the alternative mode of the above first preferred embodiment are illustrated, wherein the luminary elements 13' are electrically arranged in a specific connection on the luminary circuit 11', so as to selectively electrified with the terminals 12' for producing different colors of light and increasing the light intensity of the luminary unit 10'.

Figure 6A:
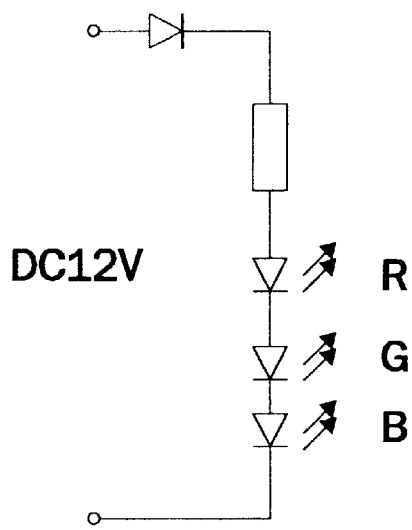
FIGS. 6A to 6E are circuit diagrams of the luminary unit of the high intensity light source arrangement according to the above first preferred embodiment of the present invention.

According to the above first preferred embodiment and its alternative mode, for producing the white light, at least a set of three luminary elements 13 or 13' which produce red, green, and blue light respectively are connected in a serial connection in such a manner that the luminary elements 13 or 13' are electrified with the terminals 12 or 12' respectively at the same time, as shown in FIG. 6A.

Figure 6B:
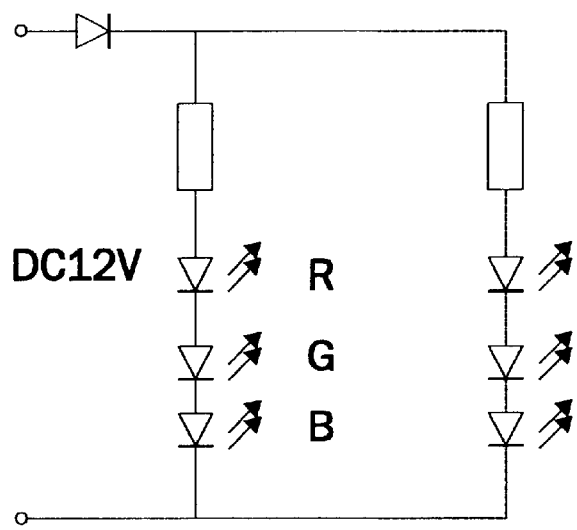

In order to increase the light intensity of the luminary unit 10, as shown in FIG. 6B, more than one set of red, blue green luminary elements 13 or 13' are provided and electrically connected in a parallel connection in such a manner that the light intensity of the luminary unit 10 or 10' is capable of selectively controlling by a predetermined current passing through each set of luminary elements 13 or 13'.

Figure 6C:
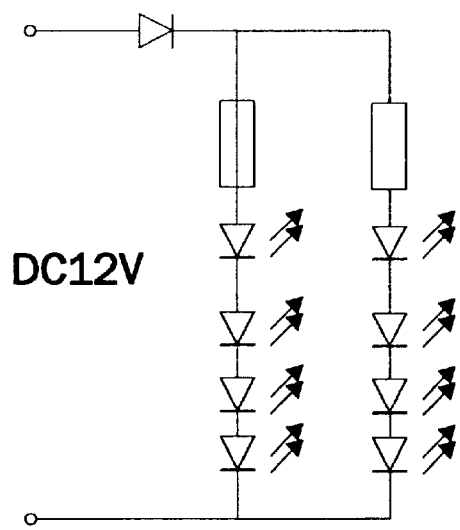
Figure 6D:
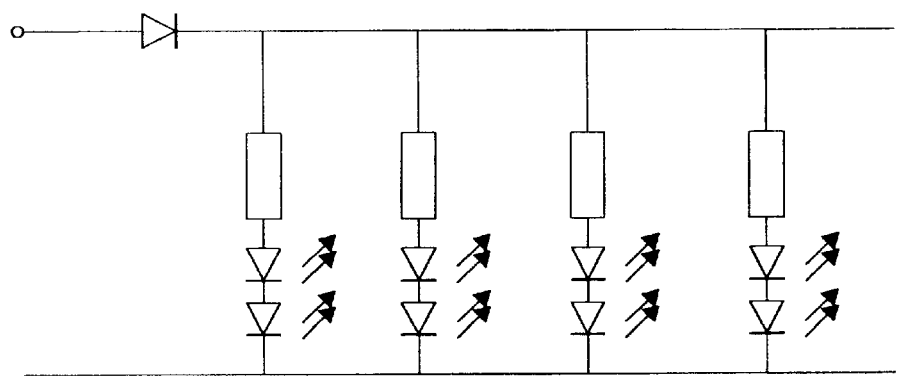
Figure 6E:
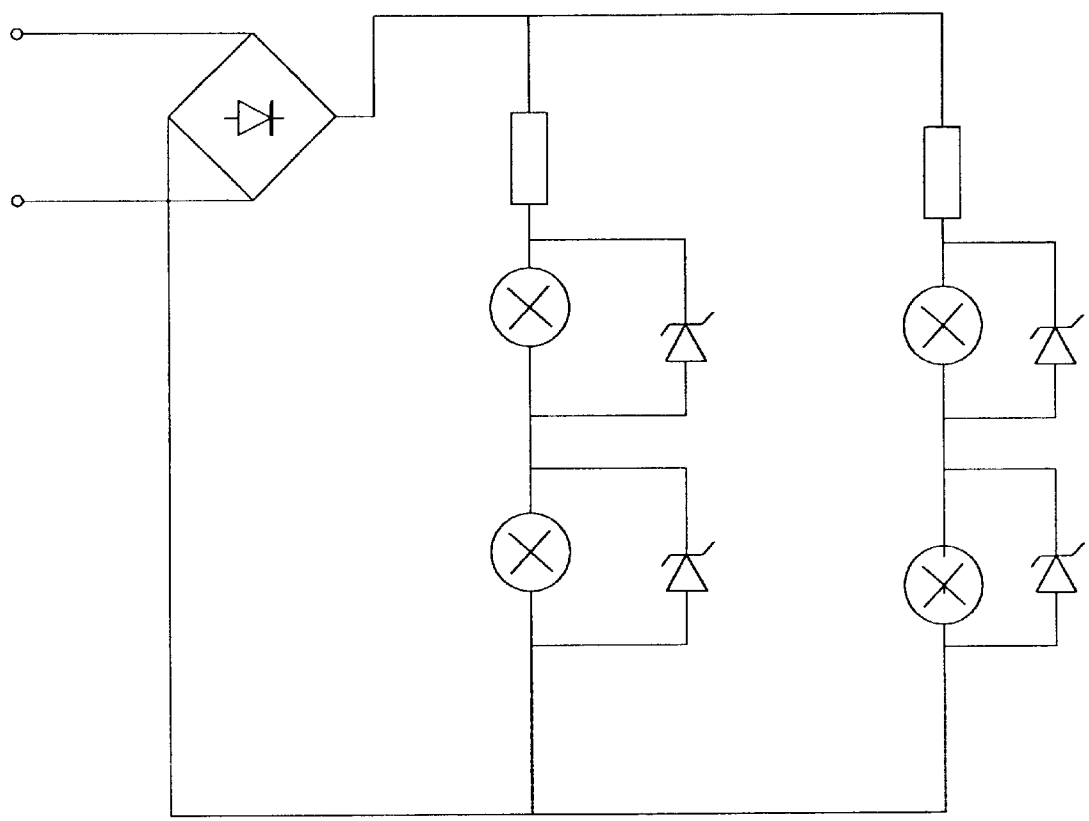

As shown in FIGS. 6C through 6E, by selectively arranging the luminary elements 13 or 13' in both serial and parallel connections for adjustably increasing the light intensity of the luminary unit 10 or 10', wherein in each set of luminary elements 13 or 13' which are made of same material, the luminary elements 13 or 13' are connected in the serial connection and adapted for producing a predetermined amount of light intensity. Thus, the predetermined sets of luminary elements 13 or 13' are connected in the parallel connection for increasing the light intensity of the luminary unit 10 or 10' by varying the current passing through the luminary circuit 11 or 11'.

In other Words, by connecting the luminary elements 13 or 13' in the serial connection, the luminary unit 10 or 10' can produce a predetermined amount of light intensity when the luminary elements 13 or 13' are made of same material and a white light when the luminary elements 13 or 13' are made of different materials adapted for producing red, green, and blue colors respectively. When the luminary elements 13 or 13' are connected in a parallel connection, the luminary unit 10 or 10' is capable of adjusting the light intensity thereof.

Alternatively, in order to produce a white light according to the above first preferred embodiment and its alternative mode, a fluorescent layer 131 is evenly coated on an outer surface of the blue light luminary elements 13 or 13', as shown in FIGS. 1 and 2, in such a manner that when the luminary elements 13 are electrified with the terminals 12 to produce the blue light which is then reflexed on the fluorescent layer 131 to form the white light. Accordingly, the fluorescent layer 131 is formed by a predetermined amount of fluorescent powder evenly adhered on the outer surface of the luminary element 13. Practically, water dissolvable chemical adhesive can be applied to adhere the fluorescent powder on the luminary element 13 or 13'. Afterwards, water content in the adhesive can be vaporized by heat so as to integrally adhere the fluorescent powder on the luminary element 13 or 13' permanently.

Figure 8:
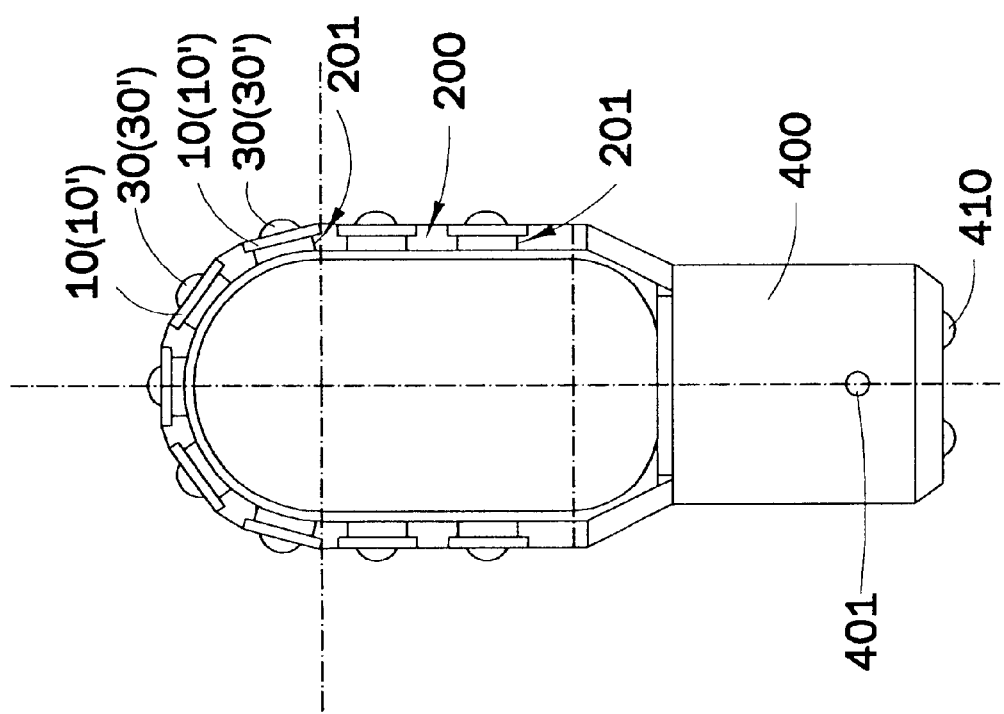
FIG. 8 is a partially sectional views of a high intensity light source arrangement according to a second preferred embodiment of the present invention.

Referring to FIG. 8, a second preferred embodiment of the present invention is illustrated, which is another alternative application of the first preferred embodiment, wherein a plurality of luminary units 10 (10') are supported around a heat dissipation unit 200 in an evenly distributing manner. According to the second embodiment, the heat dissipation unit 200 has a plurality of mounting through slots 201 spacedly formed around a curved outer surface of the heat dissipation unit 200, wherein the luminary units 10 (10') are fittedly mounted on the mounting through slots 201 of the heat dissipation unit 200 respectively. Each of the luminary units 10 (10') is arranged to be protected by the head shelter 30 (30') in such a manner that the head shelters 30' are outwardly protruded from the surface of the heat dissipation unit 200, as shown in FIG. 8. Similarly, a base housing 400 supports the heat dissipation unit 200, wherein electric input connecters 410 provided at a bottom end of the base housing 400 electrically connect to each of the luminary units 10 for electrically connecting to the power supply device. Moreover, a pair of mounting pins 401 for securely mounting the high intensity light source arrangement like a conventional light bulb to an electric socket shell.

Like what is shown in FIG. 7, the controlling device 60 can also be installed to the base housing 400 as shown in FIG. 8 for selectively controlling a flow of current passing to the luminary units 10 (10') of the second preferred embodiment. Similarly, the light control switch 61 of the controlling device 60 can be used to adjustably control the light intensity of the luminary units 10 (10') while the luminary elements 13 (13') of each of the luminary units 10 (10') are arranged in a parallel connection. The color control switch 62 of the controlling device 60 can be used to selectively produce a predetermined color of the luminary units 10 (10') while the luminary elements 13 (13') of each of the luminary units 10 (10') are arranged in a serial connection. So, the high intensity light source arrangement functions as a conventional light bulb and the high intensity light source arrangement can provide a higher light intensity and color selections while the conventional light bulb cannot.

Referring to FIG. 9, a third embodiment of the high intensity light source arrangement is illustrated, which is another alternative application of the above first preferred embodiment, wherein the base housing 40" is modified to further comprise a base 43" and a pair of supporting arms 42" upwardly extending from the base 43" for suspending the luminary unit 10" and the heat dissipation unit 20". In order words, the heat dissipation unit 20" is securely supported between two free ends of the supporting arms 42". The luminary unit 10" is arranged to face towards the base 43" in such a manner that the emitted light from the luminary unit 10" is distributing towards the base housing 40".

It is worth to mention that the high intensity light source arrangement of the third embodiment is capable of incorporating with a vehicle signal light having a concave reflective body, wherein the luminary unit 10" is positioned at a focus point of the concave reflective body in such a manner that the light from the luminary unit 10" can be directly projected on the concave reflective body for maximizing the reflecting light of the concave reflective body of the vehicle light.

FIGS. 10 and 11 illustrate a first and second alternative modes of the third embodiment, wherein the luminary unit 10A, 10B is adapted for selectively adjusting the lighting position thereof.

As shown in FIG. 10, the luminary unit 10A is arranged to face against the base housing 40A in such a manner that the emitted light from the luminary unit 10A is distributing against the base housing 40A. As shown in FIG. 11, the luminary unit 10B is arranged to face aside in such a manner that the emitted light from the luminary unit 10B is distributing sidewardly with respect to the high intensity light source arrangement. In other words, the lighting position of the luminary unit 10A, 10B, 10C can be selectively adjusted according to the need of the user.

Figure 12:
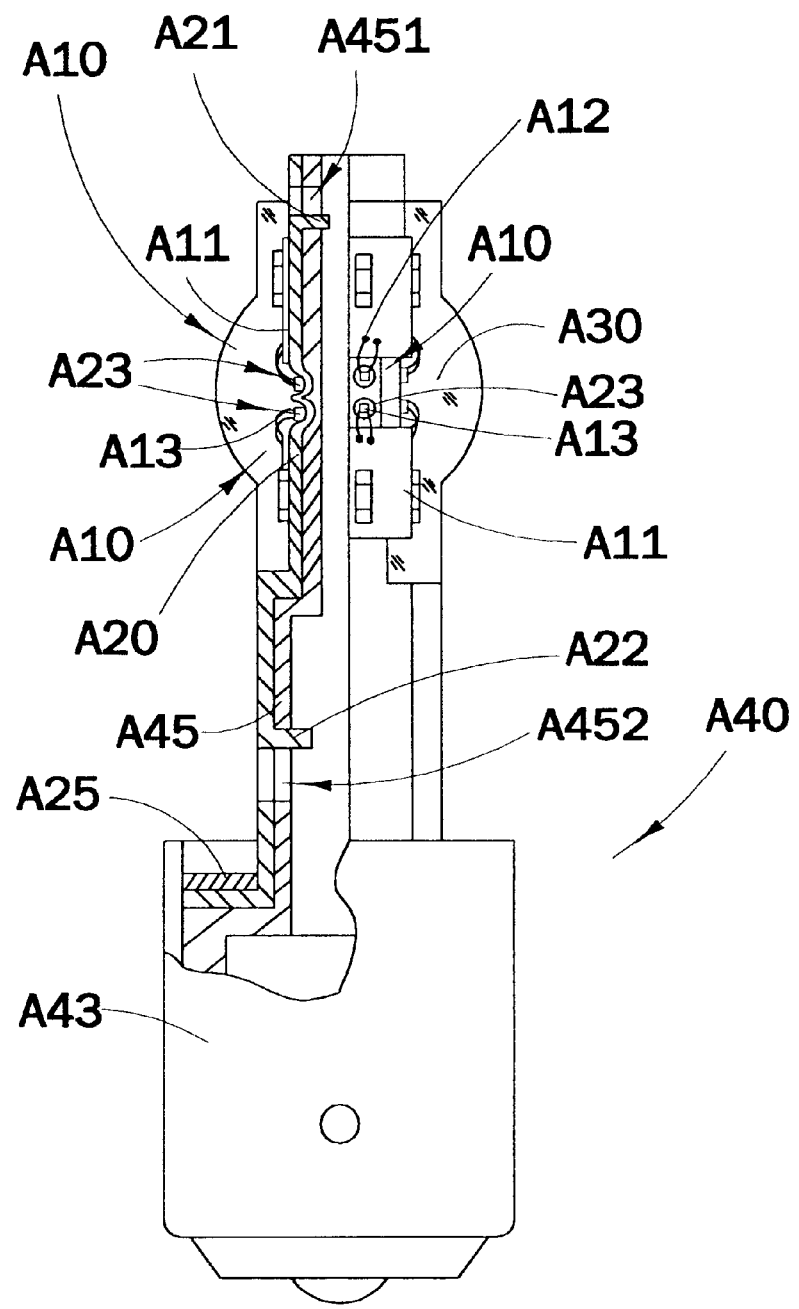
FIG. 12 is a partially sectional view of a high intensity light source arrangement according to a fourth preferred embodiment of the present invention.
Figure 13:
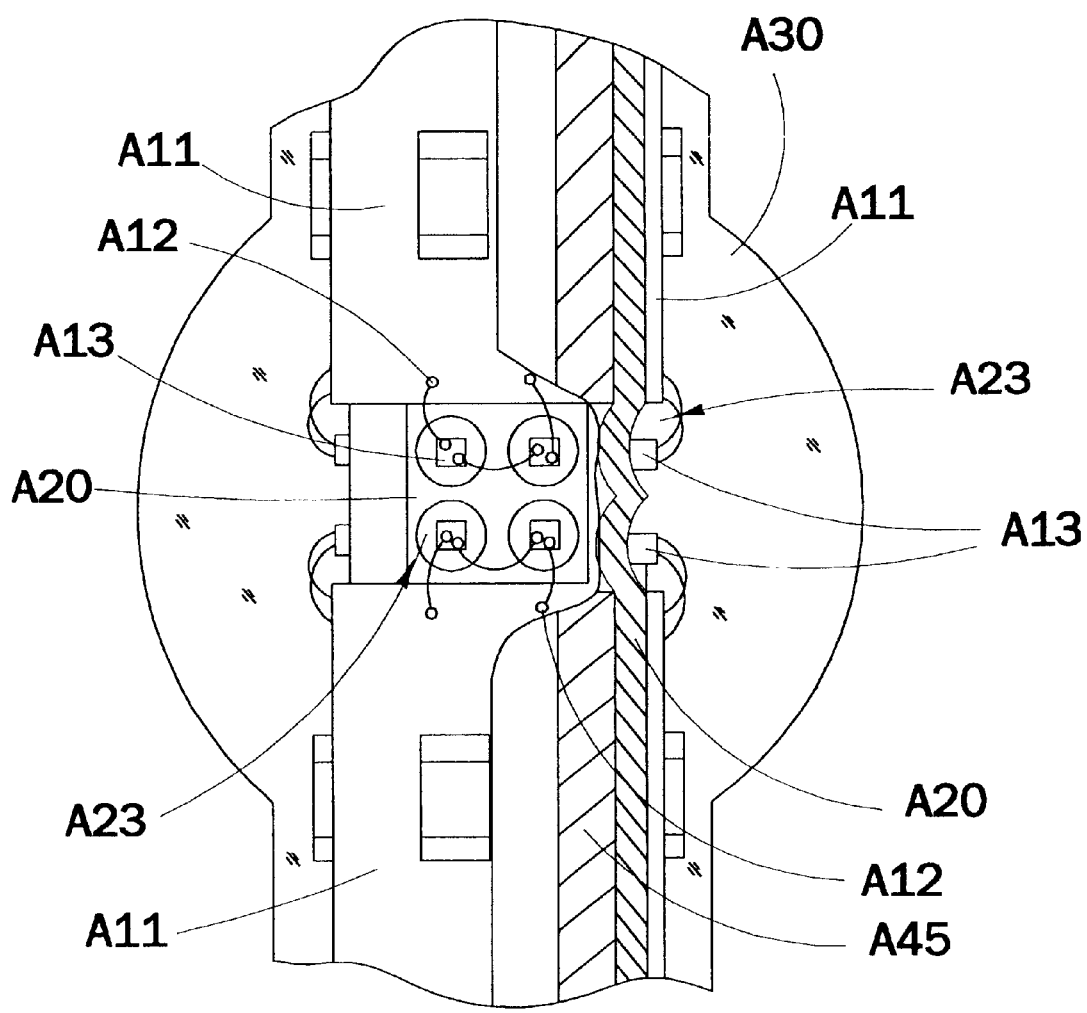
FIG. 13 is a partially sectional enlarged view of the high intensity light source arrangement according to the above fourth preferred embodiment of the present invention.
Figure 14:
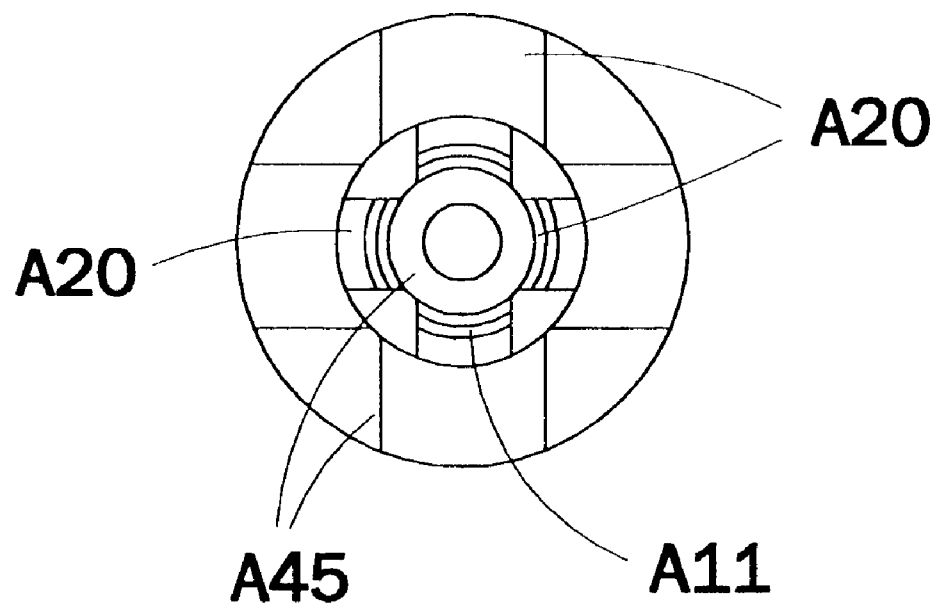
FIG. 14 is a top view illustrating the four supporting members mounted on the central shaft of the base housing of the high intensity light source arrangement according to the above fourth preferred embodiment of the present invention.

Referring to FIGS. 12 to 14, a fourth preferred embodiment of the high intensity light source arrangement is illustrated, wherein the luminary units A10 of the fourth embodiment are arranged to emit lights radially so as to enhance the light intensity of the present invention.

According to the fourth embodiment, the high intensity light source arrangement comprises a base housing A40, at least a heat dissipation unit A20 and at least a luminary unit A10. The base housing A40 further comprises a base A43 and an elongated central shaft A45 extended vertically from the base A43. There are four heat dissipation units A20 spacedly mounted on the central shaft A45 and extended along the central shaft A45, wherein the luminary units A10 are radially supported on the heat dissipation units A20 respectively.

The central shaft A45 is a hollow tubular body made of thermosetting plastic having high thermo-resistance ability that will not be deformed at 150° C. or above. The central shaft A45, as shown in FIG. 13, has four upper elongated engaging slots A451 and four lower elongated engaging slots A452 radially formed thereon, so as to mount the four heat dissipation units A20 on the central shaft A45. Of course, alternatively, the central shaft A45 can be formed to have a square, triangular or even polygon cross section and the heat dissipation units A20 are simply mounted along the side surfaces of the central shaft A45 respectively.

The heat dissipation units A20 are each made of elongated metal strip having good heat conducting ability such as copper. Each of the heat dissipation units A20 comprises an upper engaging locker A201 and a lower engaging locker A22 inwardly protruded from the supporting member A46 and arranged to engage with the respective upper and lower engaging slots A451, A452 of the central shaft A45 by inserting therethrough so as to securely mount the heat dissipation unit A20 on the central shaft A45. Each of heat dissipation units A20 further has at least a circular groove indented thereon to function as a supporting platform A23. There are four circular groove type supporting platforms A23 indented, adjacent to each other, on each of the heat dissipation units A20.

Each of the luminary units A10 according to the fourth embodiment also comprises a luminary circuit A11 having at least a terminal A12 provided thereon, and a luminary element A13. The luminary elements A13 are respectively received in the circular groove type supporting platform A23 by attaching to the curved bottom surfaces of the supporting platform A23 respectively in such a manner that the luminary elements A13 are adapted for aligning on the heat dissipation units A20 to emit light radially with respect to the base housing A40.

As shown in FIG. 13, two of the luminary circuits A11 are attached on each of the heat dissipation unit A20 and positioned above and below of the supporting platforms A13 respectively, wherein the terminals A12 provided on the luminary circuits A11 are electrically electrified with the luminary elements A13 attached on the supporting platforms A23 respectively.

Figure 16B:
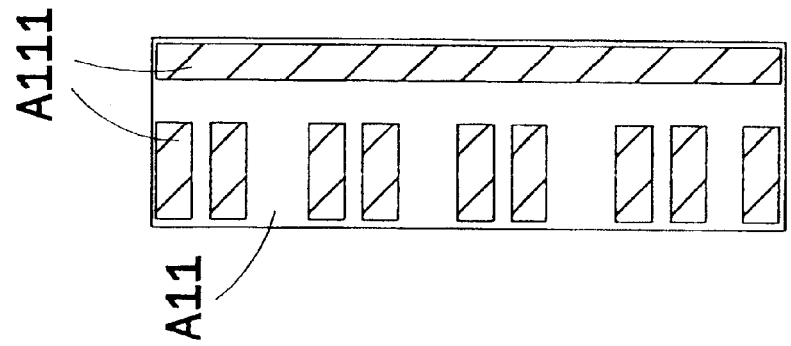
FIGS. 16A and 16B are circuit diagrams of a circuit film of the high intensity light source arrangement according to the above fourth preferred embodiment of the present invention.
Figure 16A:
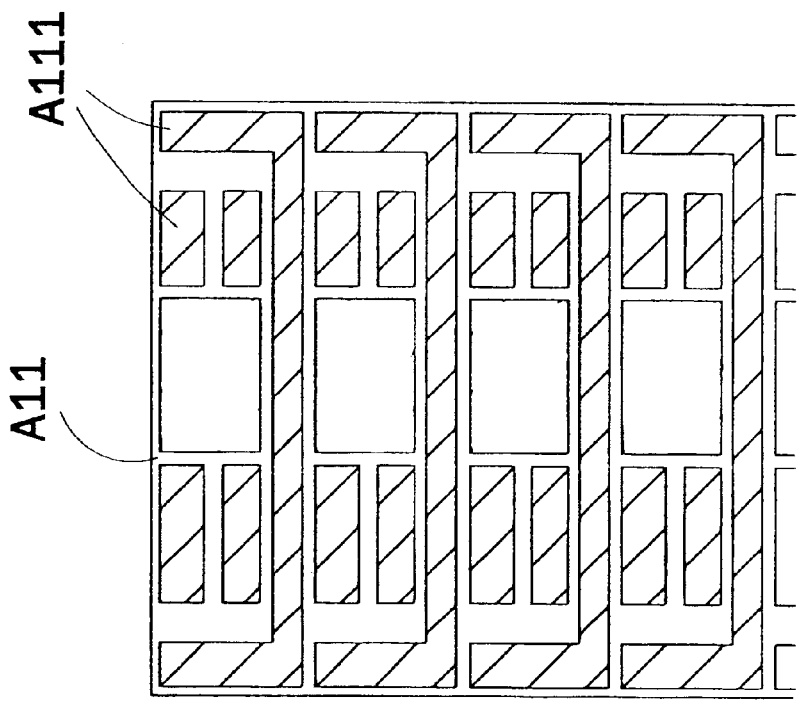

Each of the luminary circuits A11 is made of printed circuit film which is easier to adhere on the heat dissipation unit A20. Each of the luminary circuits A11 is arranged in a specific arrangement for controlling the luminary elements A13 in an electrified manner wherein at least an adhesive protecting layer A111 having high thermo-resistance ability is provided at a rear surface of the luminary circuit A11 to bond on heat dissipation unit A11, as shown in FIGS. 16A, and 16B, so as to protect the heat from the luminary element A13 damaging the luminary circuit A11.

Figure 15:
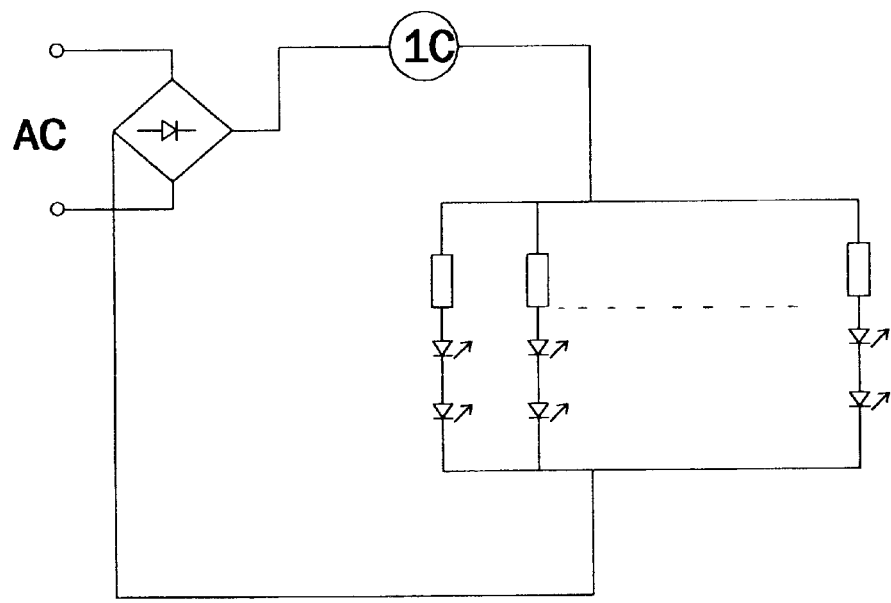
FIG. 15 is a circuit diagram of the high intensity light source arrangement according to the above fourth preferred embodiment of the present invention.

Each of the luminary elements A13 is a dual-terminal luminary element adapted for dual electrifying with the luminary circuit A11, as shown in FIG. 13, wherein the luminary circuit A11 is designed in a specific arrangement to control the electrification of the dual-terminal luminary element A13, as shown in FIG. 15.

An additional heat dissipation ring A25 is encirclingly mounted on lower potions of the four heat dissipation units A20. Accordingly, by means of the heat dissipation units A20 are directly contact with all the luminary elements A13 and the respective luminary circuits A11, a plurality of luminary elements A13 can be gathered together to increase the light intensity of light source arrangement without being burnt off by the heat because the heat generated from the luminary elements A13 are immediately transferred to the four heat dissipation units A20 respectively and then further dissipated to the heat dissipation ring A25.

The high intensity light source arrangement of the fourth embodiment also comprises a transparent head shelter A30 made of transparent material such as epoxy resin having high thermo-resistance ability. The transparent head shelter A30 has a spherical shape surrounding all the luminary circuits A11 and all the luminary elements A13 in an airtight manner, wherein the luminary elements 13 are positioned near to a center of the head shelter A30 such that the light can evenly distributed to an exterior of the head shelter A30. In other words, the supporting platforms A23 on the heat dissipation units A20 should be positioned close to the center of the head shelter A30. It is worth to mention that the shapes of the indented supporting platforms A23 and the head shelter A30 may affect the light reflection of the luminary elements A13 so as to affect the light intensity of the luminary unit A10.

Figure 19:
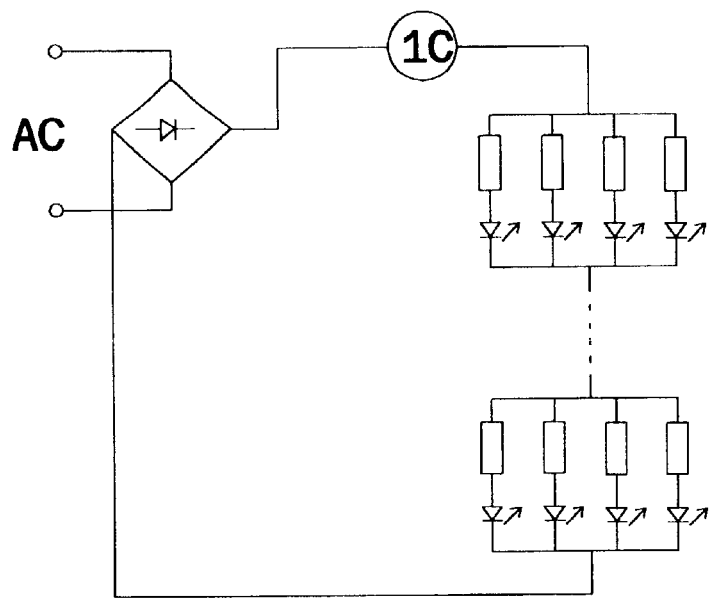
FIG. 19 is a circuit diagram of the alternative mode of the high intensity light source arrangement according to the above fourth preferred embodiment of the present invention.
Figure 17:
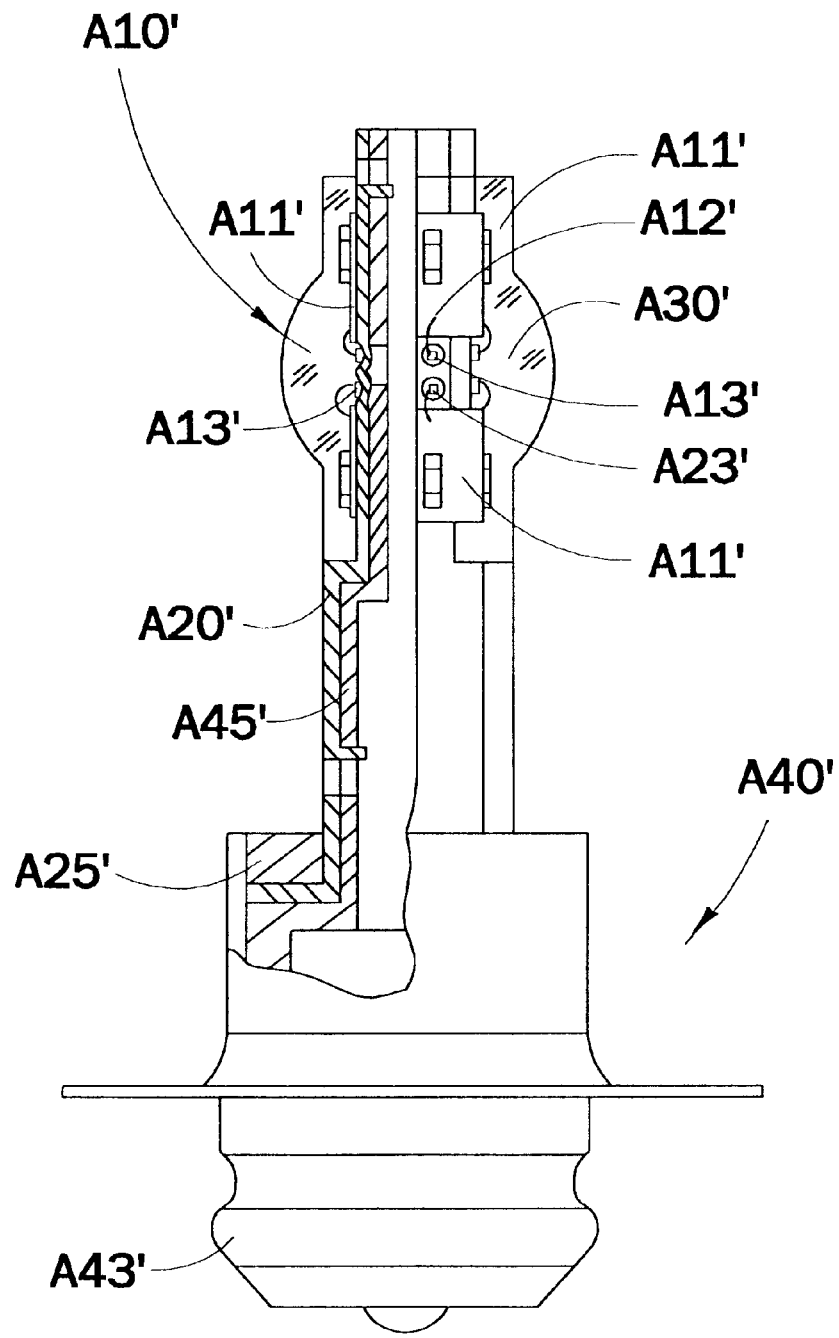
FIG. 17 is a partially sectional view of an alternative mode of the high intensity light source arrangement according to the above fourth preferred embodiment of the present invention.
Figure 18:
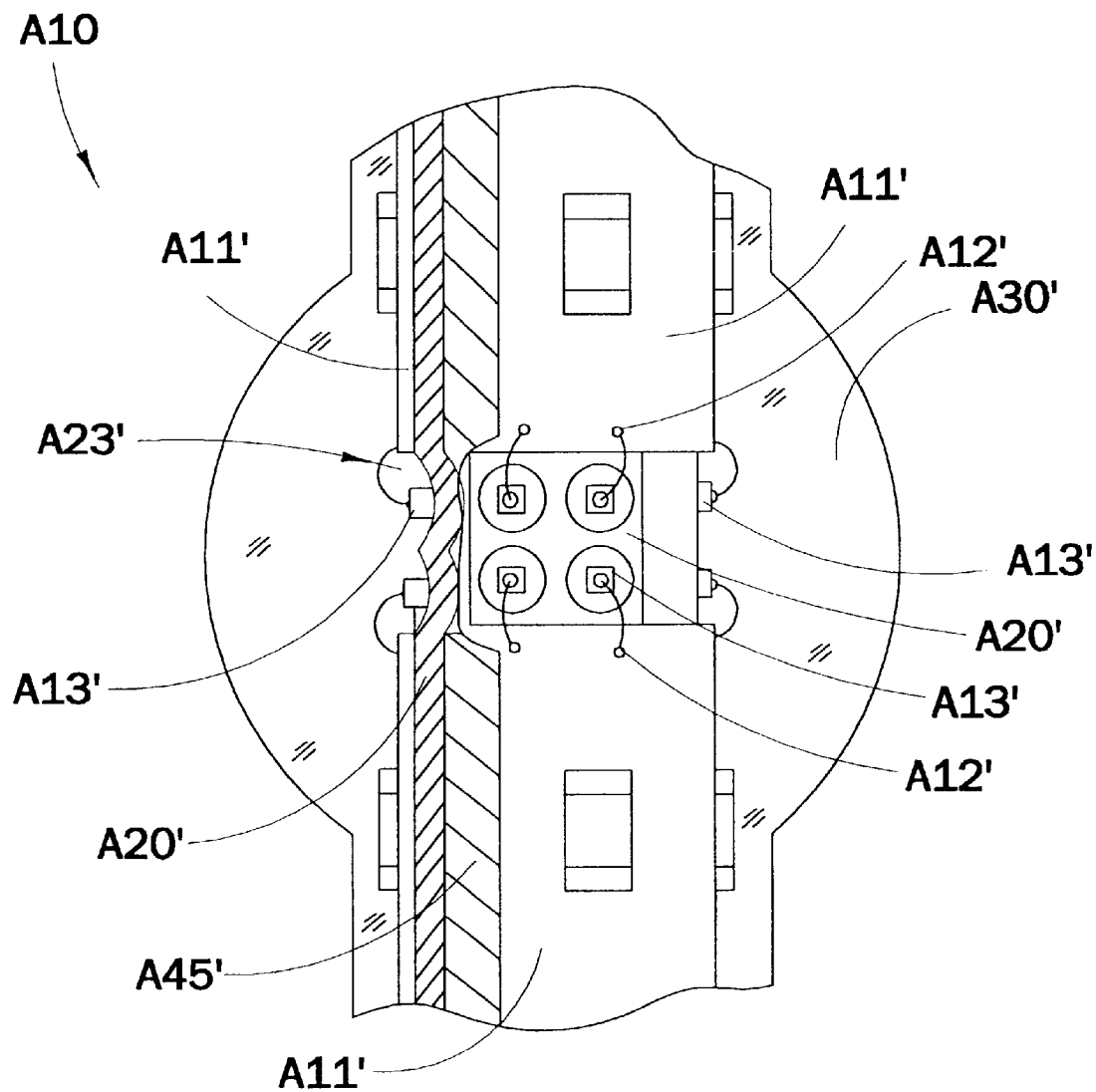
FIG. 18 is a partially sectional enlarged view of the alternative mode of the high intensity light source arrangement according to the above fourth preferred embodiment of the present invention.

FIGS. 17 to 19 illustrate an alternative mode of the above fourth embodiment having the same structural design except the luminary element A13' is a single terminal luminary element instead of the dual terminal luminary element A13.

As shown in FIG. 18, each of the luminary elements A13' is arranged to be a negative pole and the heat dissipation units A20' are electrically connected with the terminals A12' on the respective luminary circuits A13' in such a manner that the heat dissipation units A20' can provide both conduction and heat dissipating purposes. Thus, each of the luminary circuits A11' is designed in a specific arrangement to control the electrification of the single-terminal luminary element A13', as shown in FIG. 19.

Figure 20:
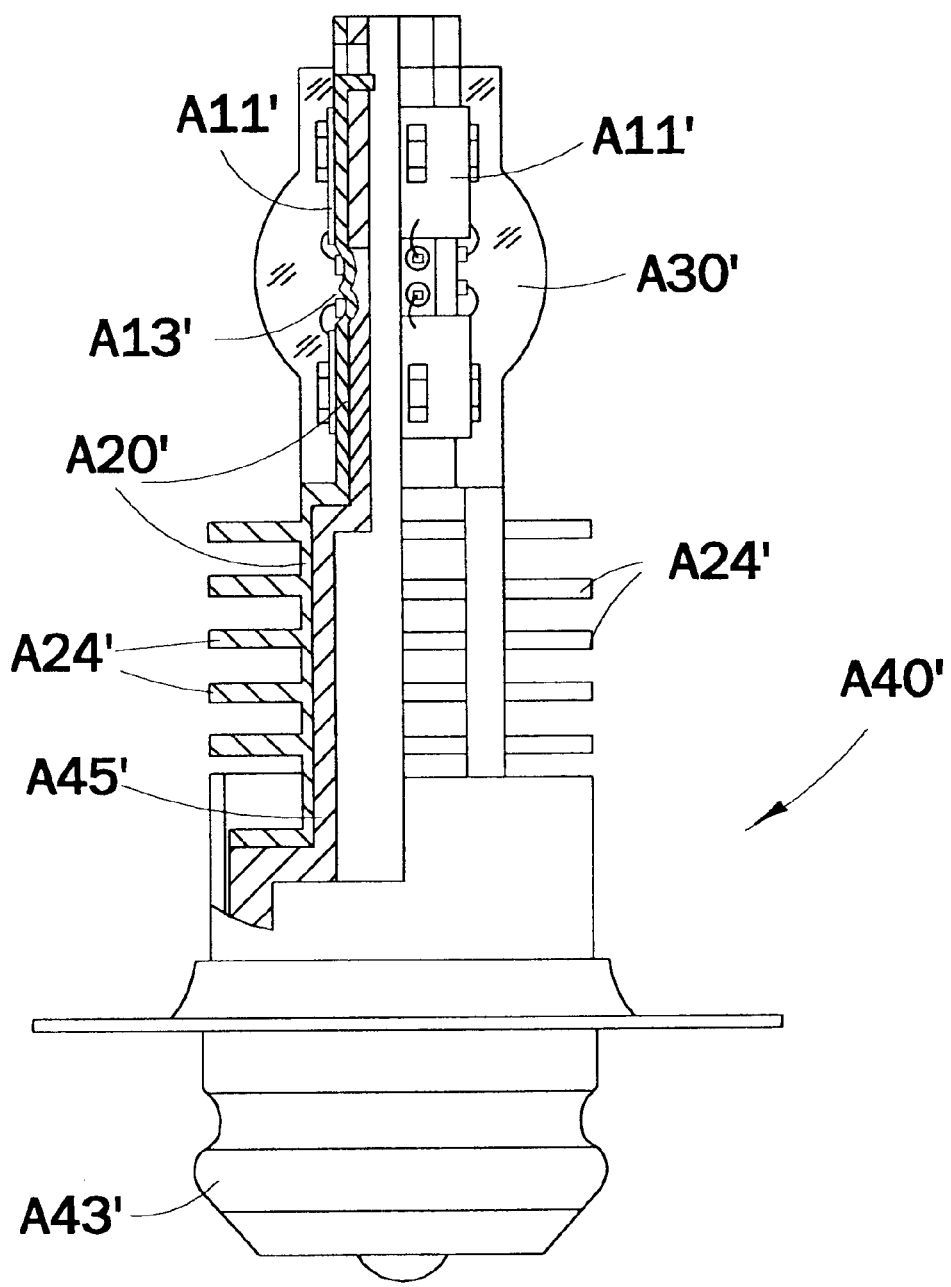
FIG. 20 illustrates an alternative mode of a heat dissipation unit of the high intensity light source arrangement according to the above fourth preferred embodiment of the present invention.

FIG. 20 illustrates an alternative mode of the heat dissipation unit A20", wherein a plurality of heat dissipating fins A24" are spacedly and radially protruded from the lower portion of the heat dissipation unit A20" for increasing the heat dissipating area of the heat dissipation unit A20" so as to enhance the heat dissipating purpose thereof. Preferably, the heat dissipating fins A24' are integrally extended from the heat dissipation unit A20" since the heat dissipation unit A20" itself is a good heat conductor so as to form a one-piece member for easy manufacture.

It is worth to mention that the high intensity light source arrangement of the fourth embodiment is capable of incorporating with a flashlight having a concave reflective body. Since the luminary unit A10 emits the light for 360°, the light can be projected on the concave reflective body for maximizing the reflecting light of the concave reflective body of the flashlight. Moreover, the multiple numbers of the luminary units A10 highly increase the light intensity of the flashlight, which is plural of the conventional light bulb type flashlight. Thus, the high intensity light source arrangement of the present invention is more durable than the conventional one that even though the flashlight is dropped on the floor, the luminary unit is still well protected without damage.

What is claimed is:

1. A high intensity light source arrangement, comprising:
    a luminary unit comprising a luminary circuit having a predetermined thickness, at least a terminal electrically connected to said luminary circuit, and at least a luminary element adapted for electrifying with said terminal to emit light;
    a heat dissipation unit supporting said luminary unit and dissipating heat generated from said luminary unit;
    a base housing supporting said heat dissipation unit and comprising an electric input connector electrically connecting to said luminary unit; and
    a head shelter for covering said luminary unit in an airtight manner so as to protect said luminary unit while said light emitted from said luminary element is capable of passing through said head shelter to outside.

2. The high intensity light source arrangement, as recited in claim 1, wherein said heat dissipation unit comprises a ring body and a ceiling wall integrally formed at a top end of said ring body, wherein said luminary circuit is attached on said ceiling wall and said head shelter is securely mounted on said ceiling wall of said heat dissipation unit in an airtight manner so as to enclose said luminary unit.

3. The high intensity light source arrangement, as recited in claim 2, wherein an auxiliary luminary circuit having a predetermined thickness, which is firmly attached to a bottom side of said ceiling wall of said heat dissipation unit and electrically connected with said luminary circuit through said ceiling wall of said heat dissipation unit.

4. The high intensity light source arrangement, as recited in claim 3, wherein said luminary circuit and said auxiliary luminary circuit are electrically connected with each other by means of conduction rivets which connect said upper luminary circuit with said lower auxiliary luminary circuit through said ceiling wall of said heat dissipation unit via insulation sleeves penetrating through said ceiling wall respectively, wherein connectors are electrically extended from said conduction rivets so as to electrically connect said luminary unit to said electric input connector of said base housing.

5. The high intensity light source arrangement, as recited in claim 2, wherein said luminary circuit of said luminary unit has a center through hole and a circular supporting platform is integrally projected from a center position of said ceiling wall of said heat dissipation unit, wherein said luminary unit securely sits on said ceiling wall of said heat dissipation unit by fittedly inserting said supporting platform into said center through hole of said luminary circuit.

6. The high intensity light source arrangement, as recited in claim 5, wherein a bottom surface and an inner circumferential side of said luminary unit are in contact with a top surface and said outer circumferential side of said ceiling wall of said heat dissipation unit, so as to ensure said heat generated from said luminary unit directly dissipating through said heat dissipation unit to outside.

7. The high intensity light source arrangement, as recited in claim 5, wherein said high intensity light source arrangement further comprises a guiding means for securely mounting said luminary unit on said heat dissipation unit in position.

8. The high intensity light source arrangement, as recited in claim 6, wherein said high intensity light source arrangement further comprises a guiding means for securely mounting said luminary unit on said heat dissipation unit in position.

9. The high intensity light source arrangement, as recited in claim 7, wherein said guiding means comprises a guiding latch which is vertically projected from a side edge of said supporting platform of said heat dissipation unit and arranged to fit into a guiding groove formed on said inner circumferential side of said center through hole of said luminary circuit in such a manner that said luminary element on said supporting platform are aligned with said terminal for electrified.

10. The high intensity light source arrangement, as recited in claim 8, wherein said guiding means comprises a guiding latch which is vertically projected from a side edge of said supporting platform of said heat dissipation unit and arranged to fit into a guiding groove formed on said inner circumferential side of said center through hole of said luminary circuit in such a manner that said luminary element on said supporting platform are aligned with said terminal for electrified.

11. The high intensity light source arrangement, as recited in claims 1, 2 or 5, wherein said luminary unit comprises totally three said luminary elements electrifying with three said terminals on said luminary circuit.

12. The high intensity light source arrangement, as recited in claim 11, wherein said three luminary elements are made of different materials adapted for producing red, green, and blue colors of light respectively, wherein a distance between said three luminary elements is minimized to ensure said red, green, and blue lights combining to form white light.

13. The high intensity light source arrangement, as recited in claim 12, further comprising a controlling device for selectively controlling a flow of current passing to said luminary unit, so as to adjust a light intensity of said luminary unit and select color of said light emitted from said luminary unit.

14. The high intensity light source arrangement, as recited in claims 1, 2, 5 or 9, wherein said head shelter is a semi-spherical shaped transparent body produced from said luminary unit and said luminary element is positioned at a center of said head shelter.

15. The high intensity light source arrangement, as recited in claim 14, wherein said heat shelter is made by molding a semi-spherical shape of transparent epoxy resin, having high thermo-resistance ability, on said luminary unit and said supporting platform so as to integrally join said luminary unit, said dissipation unit and said head shelter to form an integral body.

16. The high intensity light source arrangement, as recited in claim 11, wherein said head shelter is made by molding a semi-spherical shape of transparent epoxy resin, having high thermo-resistance ability, on said luminary unit to enclose all said luminary elements, so as to integrally join said luminary units, said heat dissipation unit and said head shelter to form an integral body.

17. The high intensity light source arrangement, as recited in claim 12, wherein said head shelter is made by molding a semi-spherical shape of transparent epoxy resin, having high thermo-resistance ability, on said luminary unit to enclose all said luminary elements, so as to integrally join said luminary unit, said heat dissipation unit and said head shelter to form an integral body.

18. The high intensity light source arrangement, as recited in claim 13, wherein said head shelter is made by molding a semi-spherical shape of transparent epoxy resin, having high thermo-resistance ability, on said luminary unit to enclose all said luminary elements, so as to integrally join said luminary unit, said heat dissipation unit and said head shelter to form an integral body.

19. The high intensity light source arrangement, as recited in claims 1, 2 or 5, wherein said luminary element comprises a blue light luminary element and a fluorescent layer covering said blue light luminary element to produce white light.

20. The high intensity light source arrangement, as recited in claim 1, wherein more than one of said luminary units are supported around said heat dissipation unit in an evenly distributing manner, wherein said heat dissipation unit has a plurality of mounting through slots spacedly formed around a curved outer surface of said heat dissipation unit, wherein said luminary units are fittedly mounted on said mounting through slots of said heat dissipationunit respectively and each of said luminary units is arranged to be protected by said head shelter in such a manner that said head shelters are outwardly protruded from an exterior surface of said heat dissipation unit.

21. The high intensity light source arrangement, as recited claim 20, further comprising a controlling device installed to said base housing for selectively controlling a flow of current passing to said luminary units so as to adjustably control a light intensity of said luminary units while said luminary elements of each of said luminary units are arranged in a parallel connection and for selectively producing a predetermined color of said luminary units while said luminary elements of each of said luminary units are arranged in serial connection.

22. The high intensity light source arrangement, as recited in claims 1, 2 or 5, wherein said base housing comprise a base and a pair of supporting arms upwardly extending from said base for suspending said luminary unit and said heat dissipation unit in such a manner that said heat dissipation unit is securely supported between two free ends of said supporting arms and said luminary unit is able to be selectively arranged to face towards said base so that light emitted from said luminary unit is distributing towards said base housing, to face against said base housing so that said light emitted from said luminary unit is distributing against said base housing, and to face aside so that said light emitted from said luminary unit is distributing sidewardly with respect to said high intensity light source arrangement.

23. The high intensity light source arrangement, as recited in claim 15, wherein said base housing comprise a base and a pair of supporting arms upwardly extending from said base for suspending said luminary unit and said heat dissipation unit in such a manner that said heat dissipation unit is securely supported between two free ends of said supporting arms and said luminary unit is able to be selectively arranged to face towards said base so that light emitted from said luminary unit is distributing towards said base housing, to face against said base housing so that said light emitted from said luminary unit is distributing against said base housing, and to face aside so that said light emitted from said luminary unit is distributing sidewardly with respect to said high intensity light source arrangement.

24. A high intensity light source arrangement, comprising:
a luminary unit comprising a luminary circuit having a predetermined thickness, at least a terminal electrically connected to said luminary circuit, and at least a luminary element adapted for electrifying with said terminal to emit light;
a heat dissipation unit supporting said luminary unit and dissipating heat generated from said luminary unit; and
a base housing supporting said heat dissipation unit and comprising an electric input connector electrically connecting to said luminary unit, wherein said base housing comprises a base and a plurality of said heat dissipation units are spacedly and parallely mounted on said central shaft and extended along said central shaft and a plurality of said luminary units are supported on said heat dissipation units respectively.

25. The high intensity light source arrangement, as recited in claim 24, wherein each of said heat dissipation units has at least a circular groove indented thereon to function as a supporting platform, and said luminary elements of said luminary units are respectively attached in said circular groove type supporting platforms in such a manner that said luminary elements are adapted for aligning on said heat dissipation units to emit light radially with respect to said base housing.

26. The high intensity light source arrangement, as recited in claim 25, wherein each of said luminary circuits is attached on said respective heat dissipation unit and positioned adjacent to said supporting platform, wherein said terminals provided on said luminary circuits are electrically electrified with said luminary elements respectively.

27. The high intensity light source arrangement, as recited in claim 26, wherein each of said luminary elements is a dual-terminal luminary element adapted for dual electrifying with said respective luminary circuit.

28. The high intensity light source arrangement, as recited in claim 26, wherein each of said luminary elements is a single terminal luminary element which is arranged to be a negative pole and each of said heat dissipation units is electrically connected with said respective terminal on said respective luminary circuit.

29. The high intensity light source arrangement, as recited in claim 26, further comprising an additional heat dissipation ring encirclingly mounted on lower potions of said heat dissipation units, which are directly contact with all said luminary elements.

30. The high intensity light source arrangement, as recited in claim 26, wherein a plurality of heat dissipating fins are spacedly and radially protruded from a lower portion of each of said heat dissipation units for increasing heat dissipating area of said heat dissipation units.

31. The high intensity light source arrangement, as recited in claim 29, wherein a plurality of heat dissipating fins are spacedly and radially protruded from a lower portion of each of said heat dissipation units for increasing heat dissipating area of said heat dissipation units.

32. The high intensity light source arrangement, as recited in claims 24, 25, 26, 27, 30 or 31, wherein said head shelter has a spherical shape surrounding all said luminary circuits and all said luminary elements in an airtight manner.

33. The high intensity light source arrangement, as recited in claim 32, wherein said head shelter is made by molding a spherical shape of transparent epoxy resin, having high thermo-resistance ability, around said luminary units to enclose all said luminary elements, so as to integrally join said luminary units, said heat dissipation units and said head shelter to form an integral body.

34. The high intensity light source arrangement, as recited in claims 24, 25, 26, 29, 30 or 31, wherein said central shaft is a hollow tubular body made of thermosetting plastic having high thermo-resistance ability, wherein said central shaft have a plurality of upper elongated engaging slots and a plurality of lower elongated engaging slots radially formed thereon, wherein said heat dissipation units are each made of elongated metal strip having good heat conducting ability and each of said heat dissipation units comprises an upper engaging locker and a lower engaging locker inwardly protruded from said supporting member and arranged to engage with said respective upper and lower engaging slots of said central shaft by inserting therethrough so as to securely mount said heat dissipation units on said central shaft.

35. The high intensity light source arrangement, as recited in claims 32, wherein said central shaft is a hollow tubular body made of thermosetting plastic having high thermo-resistance ability, wherein said central shaft has a plurality of upper elongated engaging slots and a plurality of lower elongated engaging slots radially formed thereon, wherein said heat dissipation units are each made of elongated metal strip having good heat conducting ability and each of said heat dissipation units comprises an upper engaging locker and a lower engaging locker inwardly protruded from said supporting member and arranged to engage with said respective upper and lower engaging slots of said central shaft by inserting therethrough so as to securely mount said heat dissipation units on said central shaft.

36. A high intensity light source arrangement, comprising:
a luminary unit comprising a luminary circuit having a predetermined thickness, at least a terminal electrically connected to said luminary circuit, and at least a luminary element adapted for electrifying with said terminal to emit light;
a heat dissipation unit supporting said luminary unit and dissipating heat generated from said luminary unit; and
a base housing supporting said heat dissipation unit and comprising an electric input connector electrically connecting to said luminary unit, wherein said base housing comprises a base and an elongated central shaft extended from said base, wherein said heat dissipation unit is mounted on said central shaft and extended along said central shaft and said luminary unit is supported on said heat dissipation unit.

37. The high intensity light source arrangement, as recited in claim 36, wherein said heat dissipation units has at least a circular groove indented thereon to function as a supporting platform, and said luminary element of said luminary unit are respectively attached in said circular groove type supporting platform in such a manner that said luminary element is adapted for aligning on said heat dissipation unit to emit light radially with respect to said base housing.

38. The high intensity light source arrangement, as recited in claim 37, wherein said luminary circuit is attached on said heat dissipation unit and positioned adjacent to said supporting platform, wherein said terminal provided on said luminary circuit is electrically electrified with said luminary element.

39. The high intensity light source arrangement, as recited in claim 38, wherein said luminary element is a dual-terminal luminary element adapted for dual electrifying with said luminary circuit.

40. The high intensity light source arrangement, as recited in claim 38, wherein said luminary element is a single terminal luminary element which is arranged to be a negative pole and said heat dissipation unit is electrically connected with said terminal on luminary circuit.

41. The high intensity light source arrangement, as recited in claim 38, further comprising an additional heat dissipation ring encirclingly mounted on a lower potions of said heat dissipation unit, which is directly contact with said luminary element.

42. The high intensity light source arrangement, as recited in claim 38, wherein a plurality of heat dissipating fins are spacedly and radially protruded from a lower portion of each of said heat dissipation units for increasing heat dissipating area of said heat dissipation unit.

43. The high intensity light source arrangement, as recited in claim 41, wherein a plurality of heat dissipating fins are spacedly and radially protruded from a lower portion of each of said heat dissipation unit for increasing heat dissipating area of said heat dissipation unit.

44. The high intensity light source arrangement, as recited in claims 36, 37, 38, 40, 41 or 42, wherein said head shelter has a spherical shape surrounding said luminary circuit and said luminary element in an airtight manner.

45. The high intensity light source arrangement, as recited in claim 44, wherein said head shelter is made by molding a spherical shape of transparent epoxy resin, having high thermo-resistance ability, around said luminary unit to enclose said luminary element, so as to integrally join said luminary unit, said heat dissipation unit and said head shelter to form an integral body.

46. The high intensity light source arrangement, as recited in claims 36, 37, 38, 41, 42 or 43, wherein said central shaft is a hollow tubular body made of thermosetting plastic having high thermo-resistance ability, wherein said central shaft has at least an upper elongated engaging slot and at least a lower elongated engaging slot formed thereon, wherein said heat dissipation unit is made of elongated metal strip having good heat conducting ability and comprises an upper engaging locker and a lower engaging locker inwardly protruded from said supporting member and arranged to engage with said upper and lower engaging slots of said central shaft by inserting therethrough so as to securely mount said heat dissipation unit on said central shaft.

47. The high intensity light source arrangement, as recited in claim 44, wherein said central shaft is a hollow tubular body made of thermosetting plastic having high thermo-resistance ability, wherein said central shaft has at least an upper elongated engaging slots and at least a lower elongated engaging slot formed thereon, wherein said heat dissipation unit is made of elongated metal strip having good heat conducting ability and comprises an upper engaging locker and a lower engaging locker inwardly protruded from said supporting member and arranged to engage with said respective upper and lower engaging slots of said central shaft by inserting therethrough so as to securely mount said heat dissipation units on said central shaft.

48. A high intensity light source arrangement, comprising:
a luminary unit comprising a luminary circuit having a predetermined thickness, at least a terminal electrically connected to said luminary circuit, and at least a luminary element adapted for electrifying with said terminal to emit light;
a heat dissipation unit supporting said luminary unit and dissipating heat generated from said luminary unit wherein said heat dissipation unit comprises a ring body and a ceiling wall integrally formed at a top end of said ring body, wherein said luminary circuit is attached on said ceiling wall; and
a base housing supporting said heat dissipation unit and comprising an electric input connector electrically connecting to said luminary unit.

49. The high intensity light source arrangement, as recited in claim 48, wherein an auxiliary luminary circuit having a predetermined thickness, which is firmly attached to a bottom side of said ceiling wall of said heat dissipation unit and electrically connected with said luminary circuit through said ceiling wall of said heat dissipation unit.

50. The high intensity light source arrangement, as recited in claim 49, wherein said luminary circuit and said auxiliary luminary circuit are electrically connected with each other by means of conduction rivets which connect said upper luminary circuit with said lower auxiliary luminary circuit through said ceiling wall of said heat dissipation unit via insulation sleeves penetrating through said ceiling wall respectively.

51. The high intensity light source arrangement, as recited in claim 48, wherein said luminary circuit of said luminary unit has a center through hole and a circular supporting platform is integrally projected from a center position of said ceiling wall of said heat dissipation unit, wherein said luminary unit securely sits on said ceiling wall of said heat dissipation unit by fittedly inserting said supporting platform into said center through hole of said luminary circuit.

52. The high intensity light source arrangement, as recited in claim 51, wherein a bottom surface and an inner circumferential side of said luminary unit are in contact with a top surface and said outer circumferential side of said ceiling wall of said heat dissipation unit, so as to ensure said heat generated from said luminary unit directly dissipating through said heat dissipation unit to outside.

53. The high intensity light source arrangement, as recited in claim 51, wherein said high intensity light source arrangement further comprises a guiding means for securely mounting said luminary unit on said heat dissipation unit in position.

54. The high intensity light source arrangement, as recited in claim 52, wherein said high intensity light source arrangement further comprises a guiding means for securely mounting said luminary unit on said heat dissipation unit in position.

55. The high intensity light source arrangement, as recited in claim 53, wherein said guiding means comprises a guiding latch which is vertically projected from a side edge of said supporting platform of said heat dissipation unit and arranged to fit into a guiding groove formed on said inner circumferential side of said center through hole of said luminary circuit in such a manner that said luminary element on said supporting platform are aligned with said terminal for electrified.

56. The high intensity light source arrangement, as recited in claim 54, wherein said guiding means comprises a guiding latch which is vertically projected from a side edge of said supporting platform of said heat dissipation unit and arranged to fit into a guiding groove formed on said inner circumferential side of said center through hole of said luminary circuit in such a manner that said luminary element on said supporting platform are aligned with said terminal for electrified.

57. The high intensity light source arrangement, as recited in claim 48 or 51, wherein said luminary unit comprises totally three said luminary elements electrifying with three said terminals on said luminary circuit.

58. The high intensity light source arrangement, as recited in claim 57, wherein said three luminary elements are made of different materials adapted for producing red, green, and blue colors of light respectively, wherein a distance between said three luminary elements is minimized to ensure said red, green, and blue lights combining to form white light.

59. The high intensity light source arrangement, as recited in claim 58, further comprising a controlling device for selectively controlling a flow of current passing to said luminary unit, so as to adjust a light intensity of said luminary unit and select color of said light emitted from said luminary unit.

60. The high intensity light source arrangement, as recited in claim 57, wherein said head shelter is made by molding a semi-spherical shape of transparent epoxy resin, having high thermo-resistance ability, on said luminary unit to enclose all said luminary elements, so as to integrally join said luminary units, said heat dissipation unit and said head sheltetr to form an integral body 61. The high intensity light source arrangement, as recited in claim 58, wherein said head shelter is made by molding a semi-spherical shape of transparent epoxy resin, having high thermo-resistance ability, on said luminary unit to enclose all said luminary elements, so as to integrally join said luminary units, said heat dissipation unit and said head shelter to form an integral body.

62. The high intensity light source arrangement, as recited in claim 59, wherein said head shelter is made by molding a semi-spherical shape of transparent epoxy resin, having high thermo-resistance ability, on said luminary unit to enclose all said luminary elements, so as to integrally join said luminary unit, said heat dissipation unit and said head shelter to form an integral body.

63. The high intensity light source arrangement, as recited in claim 48 or 51, wherein said luminary element comprises a blue light luminary element and a fluorescent layer covering said blue light luminary element to produce white light.

* * * * *